(12) United States Patent
Fujimori

(10) Patent No.: US 12,531,577 B2
(45) Date of Patent: Jan. 20, 2026

(54) ERROR CORRECTION DECODING DEVICE

(71) Applicant: Mitsubishi Electric Corporation, Tokyo (JP)

(72) Inventor: Takafumi Fujimori, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/734,882

(22) Filed: Jun. 5, 2024

(65) Prior Publication Data

US 2024/0333314 A1     Oct. 3, 2024

Related U.S. Application Data

(63) Continuation of application No. PCT/JP2022/002404, filed on Jan. 24, 2022.

(51) Int. Cl.
*H03M 13/00* (2006.01)
*H03M 13/11* (2006.01)
(Continued)

(52) U.S. Cl.
CPC ... *H03M 13/3723* (2013.01); *H03M 13/1108* (2013.01); *H03M 13/13* (2013.01)

(58) Field of Classification Search
CPC ............. H03M 13/13; H03M 13/3723; H03M 13/1108; H03M 13/2927; H03M 13/1111; H03M 13/2948
See application file for complete search history.

(56) References Cited

U.S. PATENT DOCUMENTS 8,621,316 B2 * 12/2013 Miyata .............. H03M 13/2945
                                                               714/701
9,742,440 B2 *  8/2017 El-Khamy ............ H03M 13/13
(Continued)

FOREIGN PATENT DOCUMENTS

EP       3 376 672 B1     9/2019
JP      2019-527978 A    10/2019
(Continued)

OTHER PUBLICATIONS

Arikan, "Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.
(Continued)

*Primary Examiner* — Esaw T Abraham
(74) *Attorney, Agent, or Firm* — Birch, Stewart, Kolasch & Birch, LLP

(57) ABSTRACT

A decoding device includes a likelihood initialization unit performing initialization process on a storage element for likelihood information used in likelihood calculation of iterative decoding process; a first likelihood calculation unit executing M separate likelihood calculations corresponding to steps 1 to M where M is an integer of 2 or more in likelihood calculation; a second likelihood calculation unit executing M separate likelihood calculations corresponding to steps M+1 to 2M in likelihood calculation of the iterative decoding process; a hard decision unit making hard decision on a likelihood calculation result and generating a decoded bit sequence; a frozen bit removing unit removing a frozen bit and a bit sequence based on a code length of the bit sequence to be decoded from the decoded bit sequence and generating a decoded information bit sequence; and a con-
(Continued)

trol unit controlling likelihood calculation of the iterative decoding process.

2 Claims, 8 Drawing Sheets

(51) Int. Cl.
*H03M 13/37* (2006.01)
*H03M 13/13* (2006.01)

(56) References Cited

U.S. PATENT DOCUMENTS

| | | | | |
|---|---|---|---|---|
| 10,312,946 | B2* | 6/2019 | Wang | H03M 13/2906 |
| 10,374,754 | B2* | 8/2019 | Shen | H03M 13/27 |
| 10,998,922 | B2* | 5/2021 | Koike-Akino | H03M 13/2906 |
| 11,695,507 | B2* | 7/2023 | Zhang | H04L 1/0071 |
| | | | | 370/329 |
| 2015/0010103 | A1* | 1/2015 | Murakami | H04B 7/0413 |
| | | | | 375/267 |
| 2019/0296776 | A1 | 9/2019 | Xu et al. | |
| 2019/0393897 | A1 | 12/2019 | Gresset | |
| 2020/0092048 | A1 | 3/2020 | Hong et al. | |
| 2022/0200634 | A1 | 6/2022 | Xu et al. | |

FOREIGN PATENT DOCUMENTS

| | | |
|---|---|---|
| JP | 2019-534651 A | 11/2019 |
| WO | WO 2021/220441 A1 | 11/2021 |

OTHER PUBLICATIONS

Feng et al., "Efficient-Memory and Low-Latency BP Decoding Algorithm for Polar Codes", IEEE Communications Letters, vol. 24, No. 6, Jun. 2020, pp. 1236-1239.
International Search Report (PCT/ISA/210) issued in PCT/JP2022/002404, dated Apr. 5, 2022.
Koike-Akino et al., "Protograph-Based Design for QC Polar Codes", IEEE International symposium on Information Theory, 2021, pp. 593-598.
Xu et al., "XJ-BP Express Journey Belief Propagation Decoding for Polar Codes", IEEE Global Communications Conference, 2015, 6 pages.
Extended European Search Report for European Application No. 22921939.9, dated Jan. 14, 2025.
Qiao et al., "A scalable ASIP for BP Polar decoding with multiple code lengths," MATEC Web of Conferences, vol. 232, 2018, pp. 1-7.

* cited by examiner

ERROR CORRECTION DECODING DEVICE

CROSS-REFERENCE TO RELATED APPLICATION

This application is a continuation application of International Application PCT/JP2022/002404, filed on Jan. 24, 2022, and designating the U.S., the entire contents of which are incorporated herein by reference.

BACKGROUND OF THE INVENTION

1. Field of the Invention

The present disclosure relates to a decoding device for decoding a quasi cyclic (QC)-polar code.

2. Description of the Related Art

When performing communication, an error correction technique is conventionally applied in general in order to cope with an error caused by noise or the like generated in a communication path. As one scheme of such an error correction technology, there is a polar code. The polar code is one form of error correction codes that can perform encoding and decoding processes with a low amount of calculation and can realize a characteristic of asymptotically approaching a Shannon limit on the basis of a concept of channel polarization. The polar code is a type of block code, and encoding is performed by repeating, for bits in a block, exclusive OR combinations and wiring change for changing a combination to be combined. The polar code has a code length of a power of 2, that is, 2n when n is a positive integer, due to construction of the code.

As a polar code decoding method, a successive cancellation decoding method in which decoding is sequentially performed bit by bit by using decoded bits in the middle of decoding and received likelihood information, a successive cancellation list decoding method in which a plurality of decoding candidates are stored and a likely candidate is finally employed as a decoding result, and the like are applied, but a longer code length results in a longer decoding process time. In addition, belief propagation (BP) decoding as an iterative decoding method used for decoding a low density parity check (LDPC) code and the like is also applicable as a polar code decoding method, but superior performance cannot be obtained as compared with the successive cancellation decoding method. In recent years, a QC-polar code capable of preventing performance degradation due to BP decoding has been proposed with respect to the polar code.

Japanese Translation of PCT International Application Laid-open No. 2019-527978 discloses a rate matching technique for block encoding in which selection is made, depending on a target code length, between performing rate matching using puncturing, shortening, or the like, and performing an encoding process for different code lengths on a repetition basis. By applying the technique of Japanese Translation of PCT International Application Laid-open No. 2019-527978, an efficient communication system and the like can be provided. In addition, Japanese Translation of PCT International Application Laid-open No. 2019-527978 clearly describes a polar code as an error correction code for performing an encoding process on a repetition basis.

In the technique described in Japanese Translation of PCT International Application Laid-open No. 2019-527978, it is disclosed that an efficient communication system and the like are provided by applying, depending on a target code length, rate matching using puncturing, shortening, or the like, or an encoding process for different code lengths on a repetition basis, but there is no disclosure of a specific configuration of a polar code decoding circuit in a case of assuming a plurality of code lengths. Each communication device constituting the communication system can support a plurality of code lengths by mounting dedicated decoding circuits corresponding to the plurality of code lengths in parallel. However, in a case where there are many combinations of code lengths assumed in the communication system, the number of decoding circuits for code lengths corresponding thereto increases accordingly. Therefore, in each communication device, an increase in a code length of a corresponding polar code results in more dedicated decoding circuits mounted in parallel and thus an increase in a circuit scale, which is a problem.

SUMMARY OF THE INVENTION

In order to solve the above-stated problems and achieve the object, a decoding device according to the present disclosure comprises: a likelihood initialization unit to perform an initialization process on a storage element for likelihood information to be used in likelihood calculation of an iterative decoding process on a basis of likelihood information to be input and a code length of a bit sequence to be decoded; a first likelihood calculation unit to execute M separate likelihood calculations corresponding to step 1 to step M where M is an integer of 2 or more, in likelihood calculation of the iterative decoding process; a second likelihood calculation unit to execute M separate likelihood calculations corresponding to step M+1 to step 2M in likelihood calculation of the iterative decoding process; a hard decision unit to make a hard decision on a result of likelihood calculation calculated by the second likelihood calculation unit and to generate a decoded bit sequence; a frozen bit removing unit to remove a frozen bit and a bit sequence based on a code length of the bit sequence to be decoded from the decoded bit sequence generated by the hard decision unit and to generate a decoded information bit sequence; and a control unit to control likelihood calculation of the iterative decoding process on a basis of a code length of the bit sequence to be decoded, wherein the first likelihood calculation unit and the second likelihood calculation unit iteratively execute likelihood calculations of one or more steps.

DETAILED DESCRIPTION OF THE
PREFERRED EMBODIMENTS

Hereinafter, a decoding device according to each embodiment of the present disclosure will be described in detail with reference to the drawings.

First Embodiment

Figure 1:
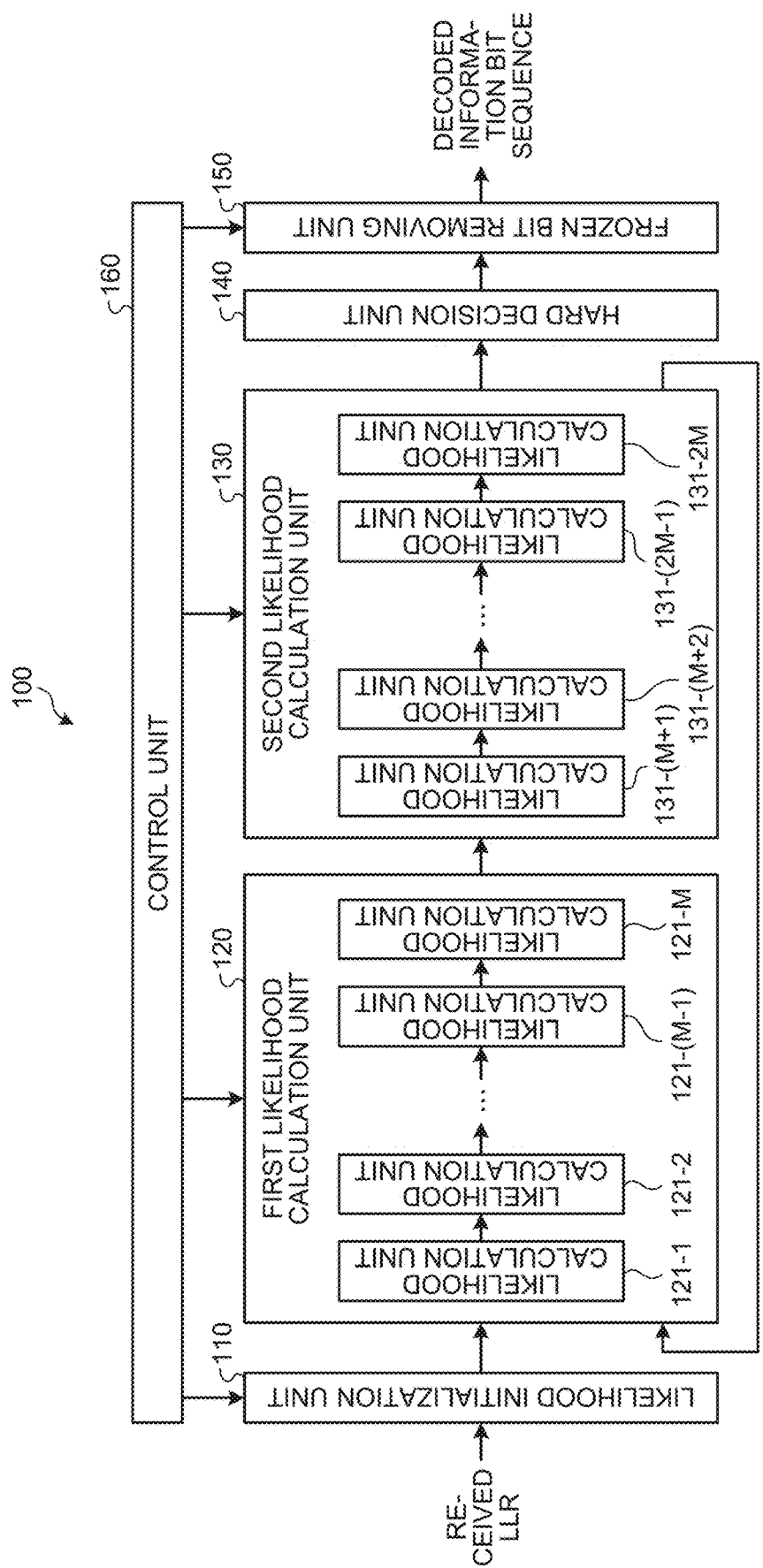
FIG. 1 is a block diagram illustrating an example configuration of a decoding device according to a first embodiment.

FIG. 1 is a block diagram illustrating an example configuration of a decoding device 100 according to a first embodiment. The decoding device 100 performs decoding by BP decoding based on a belief propagation method for a QC-polar code. The decoding device 100 includes a likelihood initialization unit 110, a first likelihood calculation unit 120, a second likelihood calculation unit 130, a hard decision unit 140, a frozen bit removing unit 150, and a control unit 160.

The first likelihood calculation unit 120 includes a likelihood calculation unit 121-1 that performs likelihood calculation of step 1, a likelihood calculation unit 121-2 that performs likelihood calculation of step 2, . . . , a likelihood calculation unit 121-(M−1) that performs likelihood calculation of step M−1, and a likelihood calculation unit 121-M that performs likelihood calculation of step M. That is, the first likelihood calculation unit 120 performs M separate likelihood calculations corresponding to step 1 to step M. In addition, the second likelihood calculation unit 130 includes a likelihood calculation unit 131-(M+1) that performs likelihood calculation of step M+1, a likelihood calculation unit 131-(M+2) that performs likelihood calculation of step M+2, . . . , a likelihood calculation unit 131-(2M−1) that performs likelihood calculation of step 2M−1, and a likelihood calculation unit 131-2M that performs likelihood calculation of step 2M. That is, the second likelihood calculation unit 130 performs M separate likelihood calculations corresponding to step M+1 to step 2M.

Here, a code construction of a QC-polar code to be decoded by the decoding device 100 will be described before describing an operation of the decoding device 100.

Figure 2:
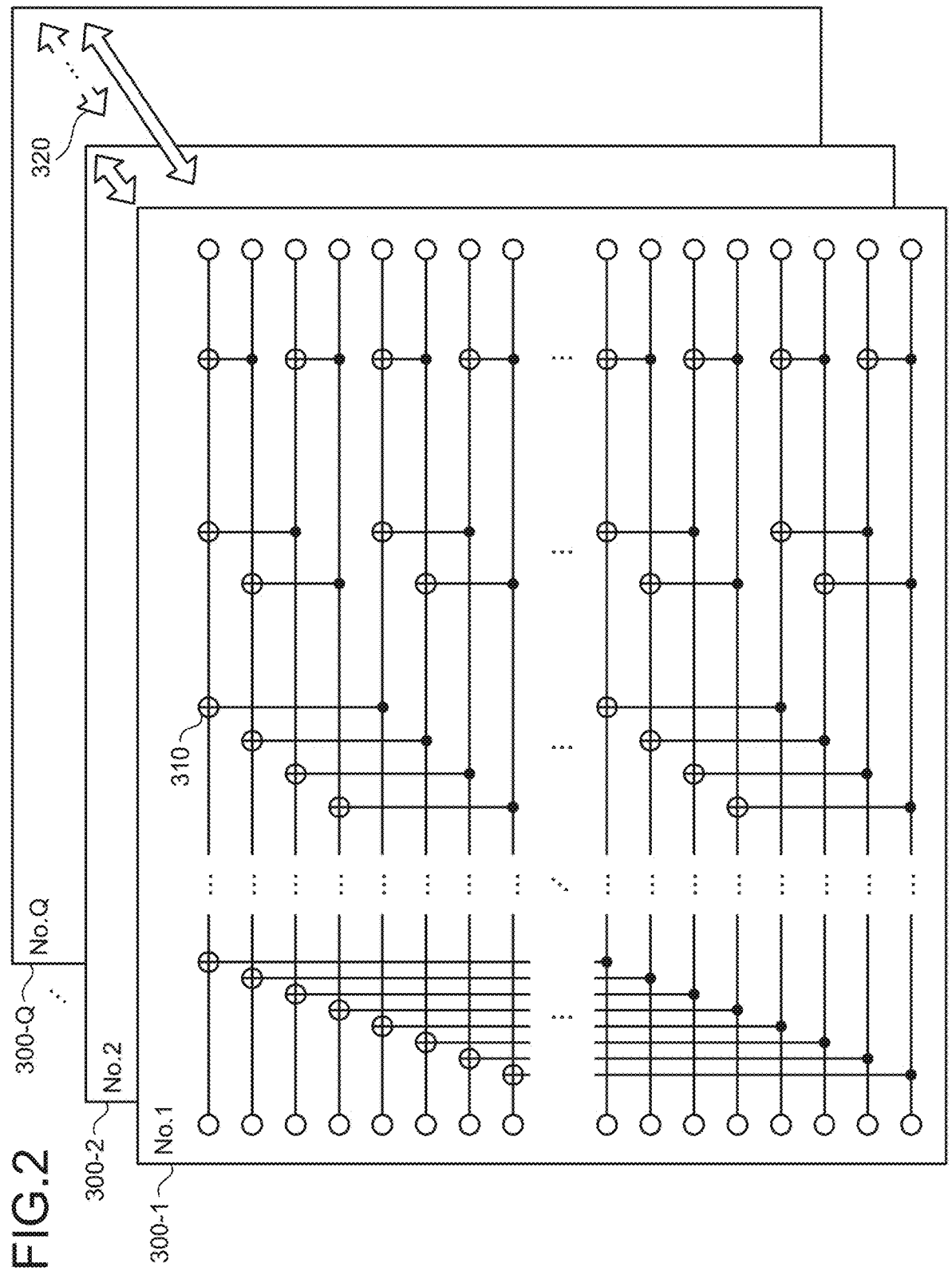
FIG. 2 is a diagram illustrating a code construction of a QC-polar code to be decoded by the decoding device according to the first embodiment.

FIG. 2 is a diagram illustrating a code construction of a QC-polar code to be decoded by the decoding device 100 according to the first embodiment. The code construction of the QC-polar code illustrated in FIG. 2 is a construction in which Q code constructions, specifically, code constructions of the polar code from a code construction 300-1 as a code construction No. 1 to a code construction 300-Q as a code construction No. Q, are mounted in parallel, and a code length of each code construction is N. Regarding the code construction of the QC-polar code, similarly to that of the polar code, encoding is performed while changing combinations of 2-bit exclusive OR processes by exclusive OR combinations 310. Furthermore, the QC-polar code becomes one code of a code length Q×N by having a construction in which each of the exclusive OR combinations 310 is connected to different one of parallel code constructions. In FIG. 2, an arrow 320 indicates an image of connection to a different parallel code construction.

The encoding of the QC-polar code will be described. In the QC-polar code illustrated in FIG. 2, bit sequences having bits as many as the number of bits of a code length of the QC-polar code including information bits and frozen bits are input to open circles on a left side, an encoding process proceeds while iterating the exclusive OR combinations 310, and the bit sequences become code words of the QC-polar code in open circles on a right side.

Figure 3:
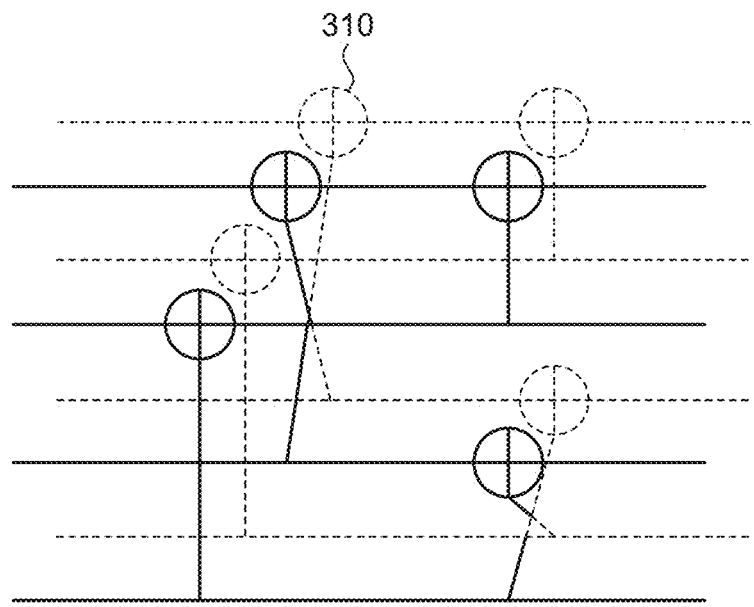
FIG. 3 is a diagram illustrating an example of a code construction having a code length of eight bits when a code length N of a polar code is equal to 4 and the number Q of parallel code constructions of the polar code is equal to 2 in the code construction of the QC-polar code illustrated in FIG. 2.

FIG. 3 is a diagram illustrating an example of a code construction having a code length of eight bits when a code length N of a polar code is equal to 4 and the number Q of parallel code constructions of the polar code is equal to 2 in the code construction of the QC-polar code illustrated in FIG. 2. The connection to a different parallel code construction illustrated in FIG. 2 means that, in the code constructions illustrated in FIG. 3 in which the code length N is equal to 4 and the number Q of parallel code constructions is equal to 2, a target of the exclusive OR combination changes across different parallel code constructions as those in upper left and lower right portions.

Figure 4:
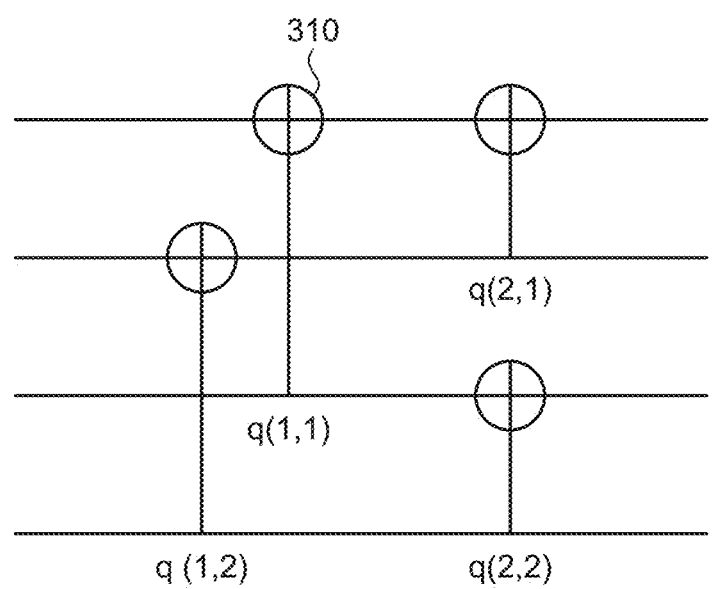
FIG. 4 is a schematic diagram illustrating a code construction when the code length N of the polar code is equal to 4 and the number of parallel code constructions of the polar code is Q in the code construction of the QC-polar code illustrated in FIG. 2.

FIG. 4 is a schematic diagram illustrating a code construction when the code length N of the polar code is equal to 4 and the number of parallel code constructions of the polar code is Q in the code construction of the QC-polar code illustrated in FIG. 2. In FIG. 4, the amounts of shift $q(1,1)$, $q(1,2)$, $q(2,1)$, and $q(2, 2)$ indicate which of the parallel code constructions is to be connected, that is, a target to be connected. For example, when the QC-polar code in which the code length N is equal to 4 and the number Q of parallel code constructions is equal to 2 illustrated in FIG. 3 is described by using the schematic diagram of the code construction of FIG. 4, the following expressions can be made: the amount of shift $q(1, 1)=1$, the amount of shift $q(1,2)=0$, the amount of shift $q(2, 1)=0$, and the amount of shift $q(2, 2)=1$. Note that the amount of shift of the target to be connected is not limited to 0 or 1, and for example, in a case where the number of parallel code constructions is Q, the amount of shift can be set to 0 to Q−1. By setting the amount of shift to 2 or more, it is possible to connect not only to adjacent parallel code constructions but also to all the parallel code constructions. The target to be connected can have different configurations depending on the code length N, the number of frozen bits, the number Q of parallel code constructions, and the like.

Figure 5:
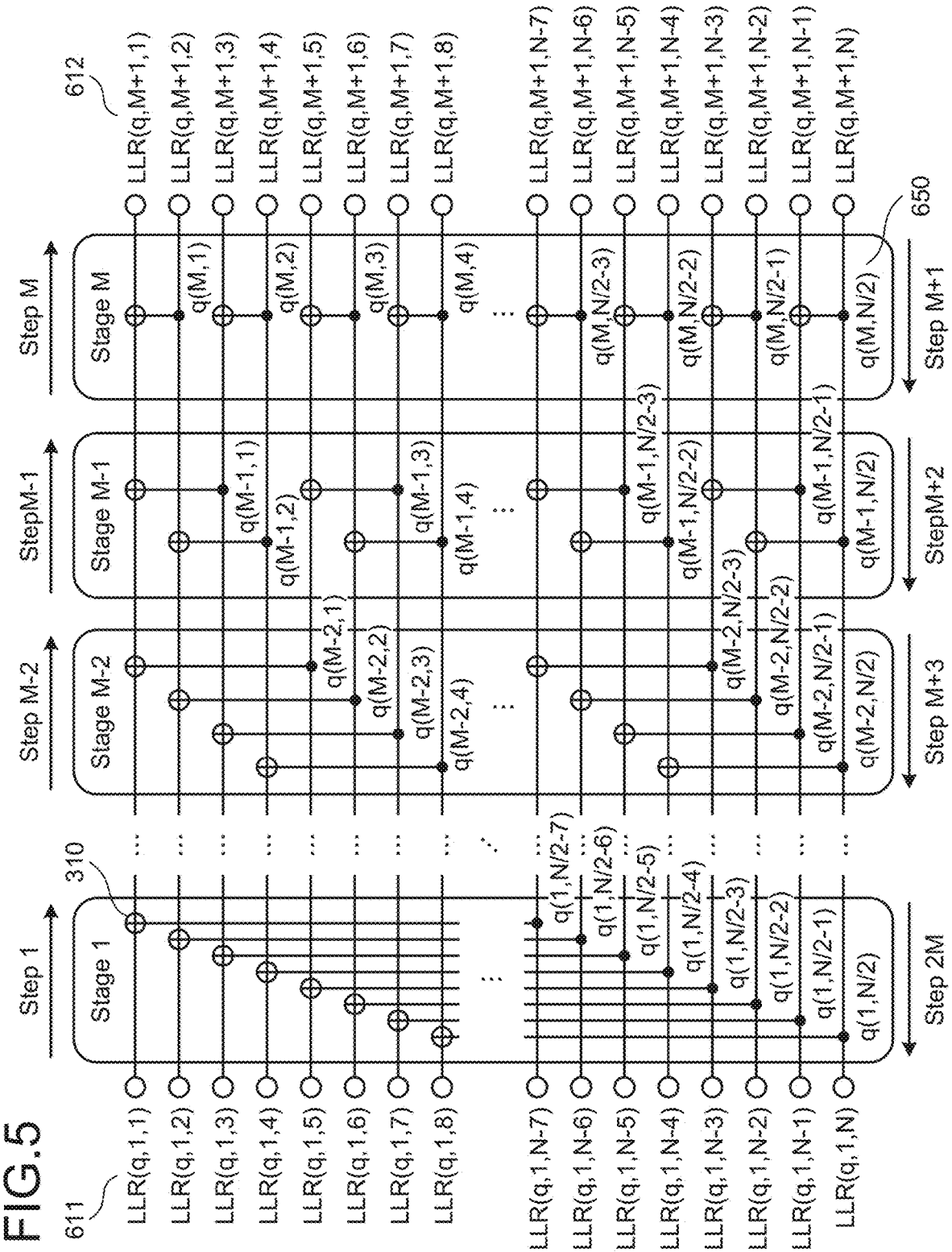
FIG. 5 is a schematic diagram illustrating the code construction of the QC-polar code illustrated in FIG. 2.

FIG. 5 is a schematic diagram illustrating the code construction of the QC-polar code illustrated in FIG. 2. FIG. 5 illustrates the QC-polar code in a case where the code length is N, the number of information bits is K, and the number of parallel code constructions is Q. Since the code length is N, the number of exclusive OR combinations denoted by M is $\log_2(N)$. In addition, since the number of information bits is K, the number of frozen bits is N−K. As the QC-polar code, the code length is Q×N, and the number of information bits is Q×K. In FIG. 5, the number of different amounts of shift q(m,n) 650 indicated by indexes m and n is M×(N/2), which is the same as the number of exclusive OR combinations 310. Note that, in each amount of shift q(m,n) 650, m is an index representing a stage and takes M values from 1 to M, and n is an index of the exclusive OR combination 310 of each stage and takes N/2 values from 1 to N/2. Stage 1 to stage M represent steps of the exclusive OR combinations 310 classified into stages, and satisfy a relationship of $M=\log_2(N)$ as described above. From step 1 to step M and from step M+1 to step 2M represent the order of steps of BP decoding of the QC-polar code, and correspond to likelihood calculations of the likelihood calculation units 121-1 to 121-M and the likelihood calculation units 131-(M+1) to 131-2M illustrated in FIG. 1, respectively.

In the BP decoding of the QC-polar code, when the encoding illustrated in FIG. 5 is performed, likelihood calculations and updates of step 1 to step M on the left side to which the bit sequences including the information bits and the frozen bits are input are sequentially executed, and next, likelihood calculations and updates of step M+1 to step 2M on the right side from which the code words are output are sequentially executed. A process in which processes of the above likelihood calculations and updates are iterated for a set number of iterations is the BP decoding of the QC-polar code. In the likelihood calculation and update processes, Q×(M+1)×N likelihood values before and after each stage are updated for each of the likelihood updates in step 1 to step M and the likelihood updates in step M+1 to step 2M.

For the description below, likelihood information at the time of updating the likelihood in step 1 to step M is denoted by L2R(q,m,n), and likelihood information at the time of updating the likelihood in step M+1 to step 2M is denoted by R2L(q,m,n). In the likelihood information L2R(q,m,n) and the likelihood information R2L(q,m,n), q=1 to Q, m=1 to (M+1), and n=1 to N. Likelihood information LLR(q,1,n) 611 and likelihood information LLR(q,M+1,n) 612 illustrated in FIG. 5 indicate likelihood information used in the decoding process, and indicate likelihood information at both ends of each update likelihood of a q-th parallel code construction. In the likelihood information LLR(q,1,n) 611 and the likelihood information LLR(q,M+1,n) 612, q=1 to Q and n=1 to N. Regarding the likelihood information described above, for example, soft decision information such as a log likelihood ratio (LLR) can be used. Note that there is likelihood information of LLR(q,m,n) between the stages, and here, q=1 to Q, m=2 to M, and n=1 to N. Hereinafter, the decoding process will be described while specifically assuming an LLR.

In the present embodiment, the decoding device 100 illustrated in FIG. 1 is a decoding circuit for a maximum code length of Q×N, and is a decoding circuit capable of performing a decoding process on a QC-polar code having a code length of Q×Nt where $Nt=2^{Mt}$, which is a power of 2 less than or equal to the code length N of the parallel code constructions. An operation of each component included in the decoding device 100 will be described below.

The likelihood initialization unit 110 initializes a storage element for the likelihood information L2R(q,m,n) and a storage element for the likelihood information R2L(q,m,n) used in the likelihood update process illustrated in FIG. 5 by using the likelihood information LLR(q,m,n) such as received LLRs. The likelihood information LLR(q,M+1,n) 612 is a received LLR of the QC-polar code input to the decoding device 100 in the present embodiment. In a case where the code length of the parallel code constructions is Nt, the likelihood information LLR(q,M+1,n) 612 is a received LLR when q=1 to Q and n=1 to Nt, and the likelihood information LLR(q,M+1,n) 612 has a positive maximum likelihood value when q=1 to Q and n=Nt+1 to N. In the likelihood information LLR(q,1,n) 611, when n=1 to Nt for a QC-polar code of which parallel code constructions have the code length Nt, a frozen bit position has a positive maximum likelihood value, an information bit position has a value of 0, and when q=1 to Q and n=Nt+1 to N in the likelihood information LLR(q,1,n) 611, a positive maximum likelihood value is obtained. A relationship is satisfied in which the likelihood information LLR(q,m,n) between the stages, that is, the likelihood information LLR(q,m,n) when q=1 to Q, m=2 to M, and n=1 to N has a value of 0.

The likelihood initialization unit 110 initializes a storage element for the likelihood information, that is, a storage element for the likelihood information L2R(q,m,n) and a storage element for the likelihood information R2L(q,m,n) by using the likelihood information LLR(q,m,n) satisfying the relationship as described above. Note that, in the likelihood initialization unit 110, an initialization position such as a frozen bit position based on the code length Q×Nt of a decoding target on which the decoding process is performed is set by the control unit 160. As described above, the likelihood initialization unit 110 performs the initialization process on the storage elements for the likelihood information used in the likelihood calculations in iterative decoding processes on the basis of likelihood information to be input and the code length of the bit sequence to be decoded. The likelihood information to be input is, for example, a received LLR.

The first likelihood calculation unit 120 and the second likelihood calculation unit 130 perform iterative decoding processes for BP decoding after the initialization by the likelihood initialization unit 110 is completed. First, before the iterative decoding processes for BP decoding are started by the first likelihood calculation unit 120 and the second likelihood calculation unit 130, the control unit 160 sets, for the likelihood calculation units 121-1 to 121-M of the first likelihood calculation unit 120 and the likelihood calculation units 131-(M+1) to 131-2M of the second likelihood calculation unit 130, the amount of shift q(m,n) 650 in each exclusive OR combination 310 depending on the code length Q×Nt of the decoding target. Here, in a case of executing the decoding process of the QC-polar code as a decoding target having a maximum code length of Q×N, in the first likelihood calculation unit 120 and the second likelihood calculation unit 130, the likelihood calculation units 121-1 to 121-M and the likelihood calculation units 131-(M+1) to 131-2M execute the likelihood calculation process for the number of iterations. On the other hand, in a case of executing the decoding process of the QC-polar code as a decoding target having a code length of Q×Nt, the control unit 160 controls likelihood calculation units that actually execute the likelihood calculation processes in the first likelihood calculation unit 120 and the second likelihood calculation unit 130, that is, likelihood calculation steps for executing the likelihood calculation processes.

For example, in a case where Nt=4 is assumed in the schematic diagram of the code construction of the QC-polar code illustrated in FIG. 5, portions in which q=1 to Q and n=1 to 4 and two stages of stage M−1 and stage M correspond to a code construction of a QC-polar code of Q×4. In addition, in a case where Nt=8 is assumed in the schematic diagram of the code construction of the QC-polar code illustrated in FIG. 5, portions in which q=1 to Q and n=1 to 8 and three stages of stage M−2, stage M−1, and stage M correspond to a code construction of a QC-polar code of Q×8. To generalize, in a case where a code length of the parallel code constructions is denoted by Nt (SN), with the use of Mt satisfying Mt=$\log_2$(Nt), portions in which q=1 to Q and n=1 to Nt and Mt stages of stage M−Mt+1 to stage M correspond to a code construction of a QC-polar code of Q×Nt. As described above, depending on the code length Q×Nt of the decoding target, the control unit 160 controls the likelihood calculation units that actually execute the likelihood calculation processes in the first likelihood calculation unit 120 and the second likelihood calculation unit 130, that is, likelihood calculation steps for executing the likelihood calculation processes.

Operations of the first likelihood calculation unit 120 and the second likelihood calculation unit 130 in the decoding process of the decoding target having a code length of Q×Nt will be described. In the decoding device 100 of the present embodiment, in the iterative decoding process at a first time, the likelihood calculation units 121-1 to 121-(M−Mt) of the first likelihood calculation unit 120 execute an initial likelihood calculation process with the use of initialized likelihood information output from the likelihood initialization unit 110 by the control of the control unit 160. Subsequently, as a likelihood calculation step of the iterative decoding process at the first time of the decoding target having a code length of Q×Nt, the likelihood calculation units 121-(M−Mt+1) to 121-M of the first likelihood calculation unit 120 execute the likelihood calculation processes by the control of the control unit 160. In addition, as the likelihood calculation step of the iterative decoding process at the first time of the decoding target having a code length of Q×Nt, the likelihood calculation units 131-(M+1) to 131-(M+Mt) of the second likelihood calculation unit 130 execute the likelihood calculation processes by the control of the control unit 160.

Thereafter, the likelihood calculation units 121-(M−Mt+1) to 121-M of the first likelihood calculation unit 120 and the likelihood calculation units 131-(M+1) to 131-(M+Mt) of the second likelihood calculation unit 130 execute the likelihood calculation processes by the control of the control unit 160 until the iterative decoding process at a last time. In the iterative decoding process at the last time, the likelihood calculation units 121-(M−Mt+1) to 121-M of the first likelihood calculation unit 120 and the likelihood calculation units 131-(M+1) to 131-(M+Mt) of the second likelihood calculation unit 130 execute the likelihood calculation processes by the control of the control unit 160, and furthermore, the likelihood calculation units 131-(M+Mt+1) to 131-2M of the second likelihood calculation unit 130 execute a terminal likelihood calculation process by the control of the control unit 160. Consequently, the likelihood calculations of the QC-polar code as a decoding target having a code length of Q×Nt by the first likelihood calculation unit 120 and the second likelihood calculation unit 130 are completed.

Figure 6:
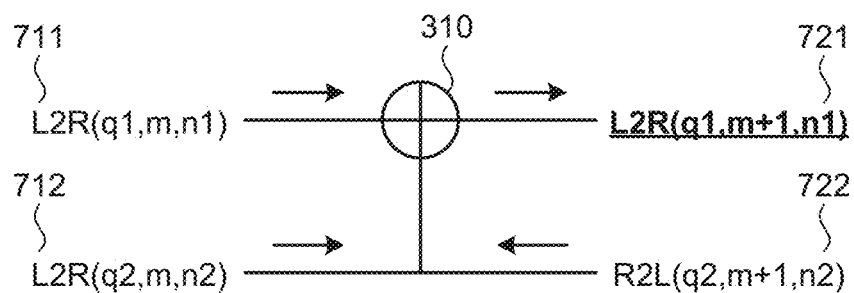
FIG. 6 is a first diagram illustrating a likelihood relationship in an exclusive OR combination in the schematic diagram illustrating the code construction of the QC-polar code illustrated in FIG. 5.
Figure 7:
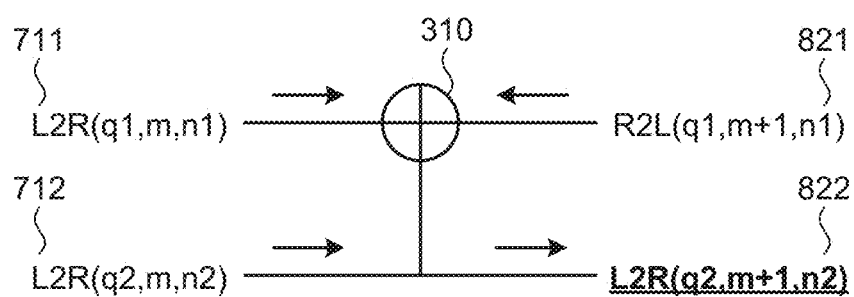
FIG. 7 is a second diagram illustrating the likelihood relationship in the exclusive OR combination in the schematic diagram illustrating the code construction of the QC-polar code illustrated in FIG. 5.
Figure 8:
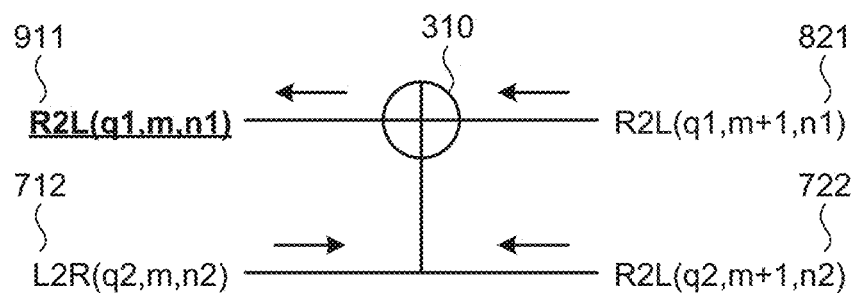
FIG. 8 is a third diagram illustrating the likelihood relationship in the exclusive OR combination in the schematic diagram illustrating the code construction of the QC-polar code illustrated in FIG. 5.
Figure 9:
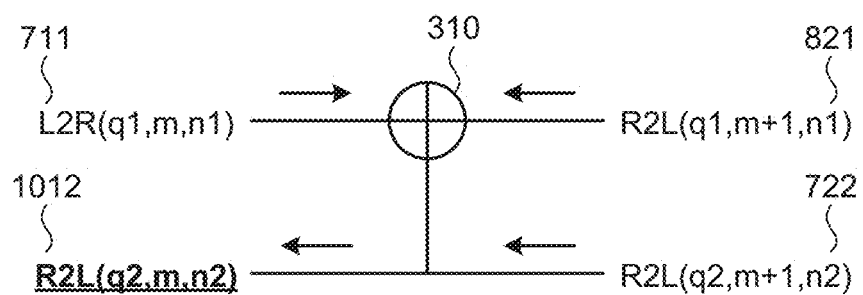
FIG. 9 is a fourth diagram illustrating the likelihood relationship in the exclusive OR combination in the schematic diagram illustrating the code construction of the QC-polar code illustrated in FIG. 5.

Here, a relationship between likelihood initialization by the likelihood initialization unit 110 and likelihood calculations by the first likelihood calculation unit 120 and the second likelihood calculation unit 130 in a case of the decoding target having a code length of Q×Nt will be described. FIG. 6 is a first diagram illustrating a likelihood relationship in an exclusive OR combination 310 in the schematic diagram illustrating the code construction of the QC-polar code illustrated in FIG. 5. FIG. 7 is a second diagram illustrating the likelihood relationship in the exclusive OR combination 310 in the schematic diagram illustrating the code construction of the QC-polar code illustrated in FIG. 5. FIG. 8 is a third diagram illustrating the likelihood relationship in the exclusive OR combination 310 in the schematic diagram illustrating the code construction of the QC-polar code illustrated in FIG. 5. FIG. 9 is a fourth diagram illustrating the likelihood relationship in the exclusive OR combination 310 in the schematic diagram illustrating the code construction of the QC-polar code illustrated in FIG. 5. FIGS. 6 and 7 are diagrams illustrating likelihood relationships in a case where likelihood calculations are performed from the left side to the right side in the schematic diagram illustrating the code construction of the QC-polar code illustrated in FIG. 5, that is, in a case where likelihood calculations are performed in the order from step 1 to step M. FIGS. 8 and 9 are diagrams illustrating likelihood relationships in a case where likelihood calculations are performed from the right side to the left side in the schematic diagram illustrating the code construction of the QC-polar code illustrated in FIG. 5, that is, in a case where likelihood calculations are performed in the order from step M+1 to step 2M.

In FIGS. 6 to 9, the likelihood information L2R(q,m,n) is likelihood information when performing likelihood calculations from the left side to the right side, and indicates input to stage m of a q-th parallel code construction and likelihood information of an n-th bit. In addition, likelihood information L2R(q, m+1, n) is likelihood information when performing likelihood calculations from the left side to the right side, and indicates output from stage m of the q-th parallel code construction and the likelihood information of the n-th bit. Similarly, in FIGS. 6 to 9, likelihood information R2L(q, m+1, n) is likelihood information when performing likelihood calculations from the right side to the left side, and indicates input to stage m of the q-th parallel code construction and the likelihood information of the n-th bit. In addition, the likelihood information R2L(q,m,n) is likelihood information when performing likelihood calculations from the right side to the left side, and indicates output from stage m of the q-th parallel code construction and the likelihood information of the n-th bit.

FIG. 6 illustrates a likelihood relationship for likelihood calculation of likelihood information L2R(q1,m+1,n1), FIG. 7 illustrates a likelihood relationship for likelihood calculation of likelihood information L2R(q2,m+1,n2), FIG. 8 illustrates a likelihood relationship for likelihood calculation of likelihood information R2L(q1,m,n1), and FIG. 9 illustrates a likelihood relationship for likelihood calculation of likelihood information R2L(q2,m,n2). A calculation formula of likelihood calculation of the likelihood relationship illustrated in FIG. 6 is expressed by formula (1), a calculation formula of likelihood calculation of the likelihood relationship illustrated in FIG. 7 is expressed by formula (2), a calculation formula of likelihood calculation of the likelihood relationship illustrated in FIG. 8 is expressed by formula (3), and a calculation formula of likelihood calculation of the likelihood relationship illustrated in FIG. 9 is expressed by formula (4). In formulas (1) to (4), a function f in each formula is calculated by a relationship of formula (5).

Formula 1:
$$L2R(q1, m+1, n1) = \\ f(L2R(q1, m, n1), L2R(q2, m, n2) + R2L(q2, m+1, n2)) \quad (1)$$

Formula 2:
$$L2R(q2, m+1, n2) = \\ f(L2R(q1, m, n1), R2L(q1, m+1, n1)) + L2R(q2, m, n2) \quad (2)$$

Formula 3:
$$R2L(q1, m, n1) = \\ f(R2L(q1, m+1, n1), L2R(q2, m, n2) + R2L(q2, m+1, n2)) \quad (3)$$

Formula 4:
$$R2L(q2, m, n2) = \\ f(L2R(q1, m, n1), R2L(q1, m+1, n1)) + R2L(q2, m+1, n2) \quad (4)$$

Formula 5:
$$f(llr1, llr2) = \text{sign}(llr1) \cdot \text{sign}(llr2) \cdot \min(|llr1|, |llr2|) \quad (5)$$

In formula (5), sign function is a function that outputs a code of likelihood information, and outputs 1 in a case of likelihood information≥0, and −1 in a case of likelihood information<0. In addition, in formula (5), min function is a function that returns a small value of likelihood information, and returns a small value as an absolute value of two pieces of likelihood information to be input.

When initialization is performed in the decoding device 100 for a maximum code length of Q×N, in the case of the decoding target having a code length of Q×Nt, the likelihood initialization unit 110 performs initialization regarding the likelihood information LLR(q,1,n) 611 and the likelihood information LLR(q, M+1,n) 612 illustrated in FIG. 5 as the positive maximum likelihood value of the likelihood information in a range in which q=1 to Q and n=Nt+1 to N.

For example, in a case of Nt=N/2 and step 1, regarding likelihood information L2R(q,1,1) to likelihood information L2R(q,1,N/2), a frozen bit position has a positive maximum likelihood value, an information bit position has a value of 0, likelihood information L2R(q,1,N/2+1) to likelihood information L2R(q,1,N) each have a positive maximum likelihood value, and likelihood information R2L(q,2,0) to likelihood information R2L(q,2,N) each have a value of 0. From the above, as a result of the likelihood calculations with formulas (1) and (2), the following relationship is satisfied: in FIGS. 6 and 7, likelihood information L2R(q1, m,n1) 711 has a positive maximum likelihood value or a value of 0, likelihood information L2R(q2,m,n2) 712 has a positive maximum likelihood value, likelihood information R2L(q1,m+1,n1) 821 and likelihood information R2L(q2, m+1,n2) 722 each have a value of 0. Therefore, likelihood information L2R(q1,m+1,n1) 721=the likelihood information L2R(q1,m,n1) is satisfied, and likelihood information L2R(q2,m+1,n2) 822 has a positive maximum likelihood value. That is, in the case of Nt=N/2 and step 1, a relationship of likelihood information L2R(q,2,n)=likelihood information L2R(q,1,n) is satisfied.

Note that, in a case of q=1 to Q, m=2 to M, and n=N/2+1 to N, the following relationship is satisfied in the likelihood information L2R(q,m,n): among those illustrated in FIGS. 6 and 7, the likelihood information L2R(q1,m,n1) 711 and the likelihood information L2R(q2,m,n2) 712 each have a positive maximum likelihood value, the likelihood information R2L(q1,m+1,n1) 821 and the likelihood information R2L(q2,m+1,n2) 722 each have a value of 0, and both the likelihood information L2R(q1,m+1,n1) and the likelihood information L2R(q2,m+1,n2) have a positive maximum likelihood value. Therefore, in the case of q=1 to Q, m=2 to M, and n=N/2+1 to N, all pieces of the likelihood information L2R(q,m,n) have a positive maximum likelihood value. In a case of Nt=N/2, since stage 2 to stage M illustrated in FIG. 5 each have a code construction of N/2, the likelihood information L2R(q,2,n)=the likelihood information L2R(q, 1,n) is satisfied in the likelihood calculation of step 1 of stage 1, and thus, iterating the likelihood calculations of stage 2 to stage M is equivalent to a decoding operation of the QC-polar code of Q×(N/2).

In addition, the likelihood calculation of the likelihood information R2L(q,m,n) in the case of q=1 to Q, m=2 to M, and n=N/2+1 to N will be described. For example, in a case of Nt=N/2 and step M+1, when q−1 to Q and n=N/2+1 to N, the likelihood information R2L(q,M+1,n) is initialized as a positive maximum likelihood value, and the likelihood of the likelihood information L2R(q,m,n) is also calculated as a positive maximum likelihood value by the previous likelihood calculation. From the above, as a result of the likelihood calculations with formulas (3) and (4), a positive maximum likelihood value is set to all of the likelihood information L2R(q1,m,n1) 711, the likelihood information L2R(q2,m,n2) 712, the likelihood information R2L(q1,m+1,n1) 821, and the likelihood information R2L(q2,m+1,n2) 722 in FIGS. 8 and 9. Therefore, the likelihood of likelihood information R2L(q1,m,n1) 911 and that of likelihood information R2L(q2,m,n2) 1012 are calculated as positive maximum likelihood value.

The same relationships as those described above apply to the likelihood calculations in step M+1 to step 2M−1, and the likelihood information R2L(q,m,n) in the case of q=1 to Q, m=2 to M, and n=N/2+1 to N is calculated as a positive maximum likelihood value. Until a terminal likelihood calculation process in the iterative decoding process at the last time, the likelihood calculation processes of step 2 to step 2M−1 are iteratively executed. In step 2M which is a terminal likelihood calculation process in the case of Nt=N/2 in the terminal likelihood calculation process in the iterative decoding process at the last time, by the likelihood calculation with formula (3), in FIG. 8, the likelihood information L2R(q2,m,n2) 712 has positive maximum likelihood value, the likelihood information R2L(q1,m+1,n1) 821 is a result of iterative likelihood calculation processes, the likelihood information R2L(q2,m+1,n2) 722 has a positive maximum likelihood value, and a relationship of the likelihood information R2L(q1,m,n1)=the likelihood information R2L(q1, m+1,n1) is satisfied. Therefore, when q=1 to Q and n=1 to N/2, regarding the likelihood information R2L(q,2,n) to be a result of the likelihood calculation processes by the first likelihood calculation unit 120 and the second likelihood calculation unit 130 and the likelihood information R2L(q, 1,n) which is a result of the terminal likelihood calculation process by the second likelihood calculation unit 130 in the case of Nt=N/2, a relationship of the likelihood information R2L(q,1,n)=the likelihood information R2L(q,2,n) is satisfied, and the result of the terminal likelihood calculation process output from the second likelihood calculation unit 130 is equivalent to the decoding result of the iterative decoding process in the case of Nt=N/2.

From the above, in the case of Nt=N/2, the likelihood initialization unit 110 performs initialization, and the first likelihood calculation unit 120 and the second likelihood calculation unit 130 perform the initial likelihood calculation process, the iterative decoding processes, and the terminal likelihood calculation process, and thereby the decoding device 100 for a maximum code length of Q×N can perform the decoding process of a decoding target having a code length of Q×(N/2). To generalize, in a case where the code length of the decoding target is Q×Nt, when q=1 to Q and n=Nt+1 to N, the likelihood information L2R(q,1,n) is initialized as a positive maximum likelihood value, in step 1 to step M−Mt corresponding to the initial likelihood calculation process of the first likelihood calculation unit 120, a relationship is satisfied in which among those illustrated in FIGS. 6 and 7, the likelihood information L2R(q1,m,n1) 711 has a positive maximum likelihood value or a value of 0, the likelihood information L2R(q2,m,n2) 712 has a positive maximum likelihood value, the likelihood information R2L(q1,m+1,n1) 821 and the likelihood information R2L(q2, m+1, n2) 722 each have a value of 0, and thereby a relationship is maintained in which the likelihood information L2R(q1,m+1,n1)=the likelihood information L2R(q1,m,n1) is satisfied and the likelihood information L2R(q2,m+1,n2) has a positive maximum likelihood value. That is, a relationship of likelihood information L2R(q, M−Mt+1, n)=the likelihood information L2R(q,1,n) is satisfied. In the case where the code length of the decoding target is Q×Nt, iterative execution of the likelihood calculation processes of stage M−Mt+1 to stage M, that is, the likelihood calculation processes of step M−Mt+1 to step M+Mt of the first likelihood calculation unit 120 and the second likelihood calculation unit 130 corresponds to iterative decoding for the code length Q×Nt, and therefore, the initialization executed by the likelihood initialization unit 110 for the code length Q×Nt of the decoding target followed by the initial likelihood calculation process executed by the first likelihood calculation unit 120 is equivalent to initialization of the likelihood information for the iterative decoding processing circuit for the code length Q×Nt.

In addition, in the initial likelihood calculation process and the likelihood calculations at the time of iterative decoding of stage M−Mt+1 to stage M, the likelihood of the likelihood information L2R(q,m,n) when q=1 to Q, m=1 to M, and n=Nt+1 to N is calculated as a positive maximum likelihood value, and the likelihood of the likelihood information R2L(q,m,n) when q=1 to Q, m=M−Mt+1, and n=Nt+1 to N is also calculated as a positive maximum likelihood value. Therefore, in the terminal likelihood calculation process for performing likelihood calculation of the likelihood information R2L(q,m,n) when q=1 to Q, m=1 to M−Mt, and n=1 to Nt, the likelihood information L2R(q2,m,n2) 712 and the likelihood information R2L(q2,m+1,n2) 722 illustrated in FIG. 8 each have a positive maximum likelihood value, and thereby the likelihood information R2L(q1,m,n1)=the likelihood information R2L(q1,m+1,n1) is satisfied, and when q=1 to Q and n=1 to Nt, a relationship of the likelihood information R2L(q,1,n)=likelihood information R2L(q, M−Mt+1,n) is satisfied. From the above, even when generalized, the likelihood initialization unit 110 initializes the likelihood depending on the code length Q×Nt of the decoding target, and the control unit 160 controls the likelihood calculation steps of the first likelihood calculation unit 120 and the second likelihood calculation unit 130, that is, applies the initial likelihood calculation process, the iterative decoding processes, and the terminal likelihood calculation process, so that the decoding process for the code length Q×Nt can be performed by the decoding device 100 for a maximum code length of Q×N.

As described above, when M is an integer of 2 or more, the first likelihood calculation unit 120 executes M separate likelihood calculations corresponding to step 1 to step M in the likelihood calculations of the iterative decoding processes. The second likelihood calculation unit 130 executes M separate likelihood calculations corresponding to step M+1 to step 2M in the likelihood calculations of the iterative decoding processes. The first likelihood calculation unit 120 and the second likelihood calculation unit 130 iteratively execute likelihood calculations of one or more steps. In addition, when Mt is a positive integer less than or equal to M, the first likelihood calculation unit 120 performs, by the control of the control unit 160, the initial likelihood calculation process for executing M−Mt separate likelihood calculations corresponding to step 1 to step M−Mt, and the iterative decoding processes for iteratively executing Mt separate likelihood calculations corresponding to step M−Mt+1 to step M. The second likelihood calculation unit 130 performs, by the control of the control unit 160, the iterative decoding processes for iteratively executing Mt separate likelihood calculations corresponding to step M+1 to step M+Mt, and the terminal likelihood calculation process for executing M−Mt separate likelihood calculations corresponding to step M+Mt+1 to step 2M.

The hard decision unit 140 makes a hard decision on a result of the likelihood calculation calculated by the second likelihood calculation unit 130, that is, the likelihood information R2L(q,1,n) which is a result of the likelihood calculation process when q=1 to Q and n=1 to N output from the second likelihood calculation unit 130, and generates a decoded bit sequence as a result of the hard decision. The hard decision unit 140 makes the hard decision by using the likelihood information after completion of iterative likelihood calculations by the first likelihood calculation unit 120 and the second likelihood calculation unit 130.

The frozen bit removing unit 150 removes frozen bits and unnecessary bit sequences where n=Nt+1 to N from the decoded bit sequence generated by the hard decision unit 140, and generates and outputs a decoded information bit sequence to be output from the decoding device 100 of the present embodiment. The unnecessary bit sequences where n=Nt+1 to N are bit sequences based on the code length of the bit sequence to be decoded. The frozen bit removing unit 150 generates, from the decoded bit sequence, a decoded information bit sequence having a length based on the code length of the bit sequence to be decoded. Consequently, the decoding process of the decoding target having a code length of Q×Nt by the decoding device 100 is completed.

The control unit 160 controls likelihood calculations of the iterative decoding processes by the decoding device 100 on the basis of the code length of the bit sequence to be decoded. Specifically, the control unit 160 controls information to be used by the frozen bit removing unit 150 about a removal position of an unnecessary bit sequence based on the code length Q×Nt of the decoding target, and the like. The control unit 160 controls information on, for example, a frozen bit position based on the code length Q×Nt of the decoding target with respect to the likelihood initialization unit 110 and the frozen bit removing unit 150, and controls likelihood calculation steps of the first likelihood calculation unit 120 and the second likelihood calculation unit 130. As described above, on the basis of the code length of the bit sequence to be decoded, the control unit 160 controls a position initialized by the likelihood initialization unit 110, the likelihood calculation steps by the first likelihood calculation unit 120 and the second likelihood calculation unit 130, and a position where a frozen bit is removed by the frozen bit removing unit 150. In addition, on the basis of the code length of the bit sequence to be decoded, the control unit 160 changes the amount of shift q(m,n) 650 in each exclusive OR combination 310 in the likelihood calculations by the first likelihood calculation unit 120 and the second likelihood calculation unit 130.

By the control of the control unit 160, the likelihood initialization unit 110 initializes a storage element at the information bit position of the bit sequence to be decoded with a value of 0, and initializes a storage element at an intermediate value of the likelihood calculations by the first likelihood calculation unit 120 and the second likelihood calculation unit 130 with a value of 0. In addition, by the control of the control unit 160, the likelihood initialization unit 110 initializes a storage element at the frozen bit position of the bit sequence to be decoded with a positive maximum likelihood value, and initializes a storage element corresponding to a code length as a difference between the maximum code length decodable by the decoding device 100 and the code length of the bit sequence to be decoded with a positive maximum likelihood value.

Next, a hardware configuration of the decoding device 100 will be described. In the decoding device 100, the likelihood initialization unit 110, the first likelihood calculation unit 120, the second likelihood calculation unit 130, the hard decision unit 140, the frozen bit removing unit 150, and the control unit 160 are realized by a processing circuitry. The processing circuitry may be a processor that executes a program stored in a memory and the memory, or may be dedicated hardware. The processing circuitry is also referred to as a control circuit.

Figure 10:
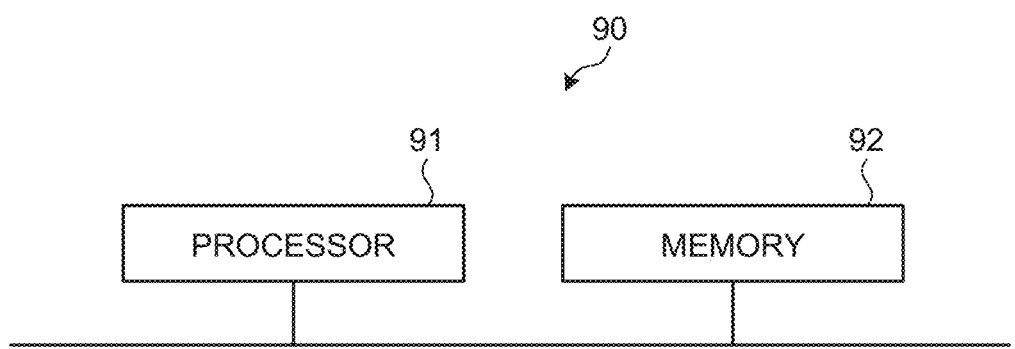
FIG. 10 is a diagram illustrating an example configuration of a processing circuitry in a case where a processing circuitry that realizes the decoding device according to the first embodiment is realized by a processor and a memory.

FIG. 10 is a diagram illustrating an example configuration of a processing circuitry 90 in a case where a processing circuitry that realizes the decoding device 100 according to the first embodiment is realized by a processor 91 and a memory 92. The processing circuitry 90 illustrated in FIG. 10 is a control circuit, and includes the processor 91 and the memory 92. In a case where the processing circuitry 90 is constituted with the processor 91 and the memory 92, functions of the processing circuitry 90 are realized by software, firmware, or a combination of software and firmware. The software or the firmware is described as a program and stored in the memory 92. In the processing circuitry 90, the processor 91 reads and executes the program stored in the memory 92, thereby realizing the functions. That is, the processing circuitry 90 includes the memory 92 for storing a program with which a process of the decoding device 100 is executed as a result. It can also be said that this program is a program for causing the decoding device 100 to execute the functions realized by the processing circuitry 90. This program may be provided by a storage medium having the program stored therein, or may be provided by other means such as a communication medium.

It can also be said that the above program is a program that causes the decoding device 100 to execute: an initialization step, performed by the likelihood initialization unit 110, of performing an initialization process of a storage element for likelihood information to be used in likelihood calculation of the iterative decoding process by using likelihood information to be input on the basis of control information from the control unit 160 based on the code length of the bit sequence to be decoded; an initial likelihood calculation process step, performed by the first likelihood calculation unit 120 capable of executing M separate likelihood calculations corresponding to step 1 to step M where M is an integer of 2 or more, of executing a likelihood calculation step other than a likelihood calculation step of a target of the iterative decoding process in the iterative decoding process at the first time; an iterative decoding process step, performed by the first likelihood calculation unit 120, and the second likelihood calculation unit 130 capable of executing M separate likelihood calculations corresponding to step M+1 to step 2M, of executing a likelihood calculation step of the target of the iterative decoding process for a number of iterations of the iterative decoding process; a terminal likelihood calculation process step, performed by the second likelihood calculation unit 130, of executing a likelihood calculation step other than a likelihood calculation step of the target of the iterative decoding process in the iterative decoding process at the last time; a hard decision step, performed by the hard decision unit 140, of making a hard decision on a result of likelihood calculation obtained by execution of the iterative decoding process by the first likelihood calculation unit 120 and the second likelihood calculation unit 130, and generating a decoded bit sequence; and a removal step, performed by the frozen bit removing unit 150, of removing a frozen bit and a bit sequence based on a code length of the bit sequence to be decoded from the decoded bit sequence, and generating a decoded information bit sequence.

Here, the processor 91 is, for example, a central processing unit (CPU), a processing device, an arithmetic device, a microprocessor, a microcomputer, or a digital signal processor (DSP). The memory 92 corresponds to, for example, a non-volatile or volatile semiconductor memory such as a random access memory (RAM), a read only memory (ROM), a flash memory, an erasable programmable ROM (EPROM), or an electrically EPROM (EEPROM (registered trademark)), a magnetic disk, a flexible disk, an optical disk, a compact disc, a mini disk, or a digital versatile disc (DVD).

Figure 11:
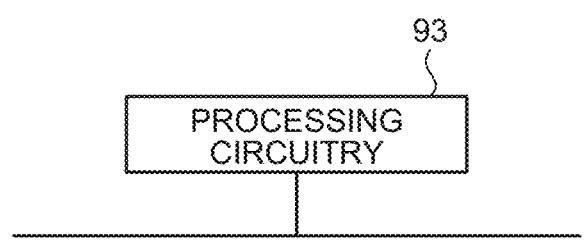
FIG. 11 is a diagram illustrating an example of a processing circuitry in a case where the processing circuitry that realizes the decoding device according to the first embodiment is configured with dedicated hardware.

FIG. 11 is a diagram illustrating an example of a processing circuitry 93 in a case where the processing circuitry that realizes the decoding device 100 according to the first embodiment is configured with dedicated hardware. The processing circuitry 93 illustrated in FIG. 11 corresponds to, for example, a single circuit, a composite circuit, a programmed processor, a parallel programmed processor, an application specific integrated circuit (ASIC), a field programmable gate array (FPGA), or a combination thereof. A part of the processing circuitry may be realized by dedicated hardware and another part thereof may be realized by software or firmware. Thus, the processing circuitry can realize each of the above-described functions by dedicated hardware, software, firmware, or a combination thereof.

As described above, according to the present embodiment, the decoding device 100 controls the likelihood calculation units that perform the initial likelihood calculation process, the iterative decoding processes, and the terminal likelihood calculation process depending on the code length Q×Nt of the decoding target. Consequently, the decoding device 100 can share the decoding circuit for the QC-polar code as a decoding target having a code length of Q×Nt, the code length being a power of 2 less than or equal to the maximum code length in the parallel code constructions, by utilizing an encoding law of the QC-polar code and features of an exclusive OR operation, and using the decoding circuit for the QC-polar code having a maximum code length of the parallel code constructions, which is assumed to be Q×N. In addition, by sharing the decoding circuit, the decoding device 100 can avoid mounting respective decoding circuits corresponding to a plurality of code lengths in parallel, and can prevent a circuit scale from increasing. Furthermore, with the use of the decoding circuit for the QC-polar code having the maximum code length, the decoding device 100 can shorten decoding delay caused by controlling a decoding process depending on a code length as compared with a case of using a rate conversion process such as puncturing or shortening. As described above, the decoding device 100 can perform decoding for a plurality of code lengths in decoding of the QC-polar code while preventing a circuit scale from increasing.

Second Embodiment

Figure 12:
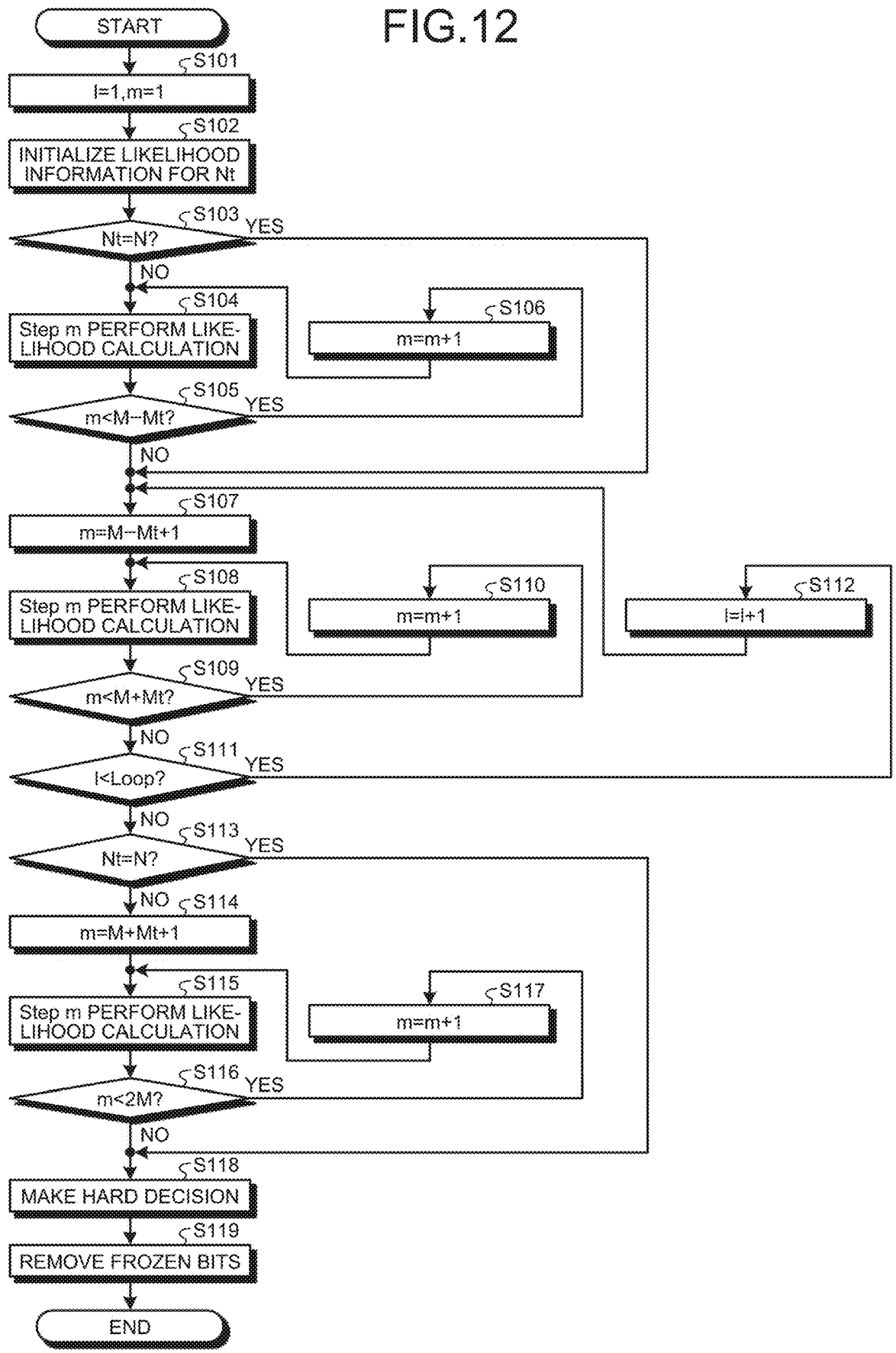
FIG. 12 is a flowchart illustrating an operation of the decoding device according to a second embodiment.

In a second embodiment, a decoding process for a QC-polar code performed by the decoding device 100 will be described with reference to a flowchart. FIG. 12 is a flowchart illustrating an operation of the decoding device 100 according to the second embodiment. The flowchart illustrated in FIG. 12 illustrates the decoding process by the decoding device 100 for the QC-polar code having a maximum code length of Q×N where N=$2^M$, performed for the decoding target having a code length of Q×Nt where Nt≤N and Nt=$2^{Mt}$, as described in the first embodiment. Note that, in the flowchart illustrated in FIG. 12, "Loop" represents the number of iterations of the iterative decoding process. To do begin with, input of a signal which is a target of a decoding process to the decoding device 100 will be described.

In step S101, the control unit 160 sets an index 1 of Loop which is the number of iterations of the iterative decoding process to 1, and sets an index m representing the likelihood calculation step described in the first embodiment to 1.

In step S102, the likelihood initialization unit 110 initializes likelihood information for Nt, that is, initializes a storage element for likelihood information depending on the code length Q×Nt of the decoding target.

In step S103, the control unit 160 compares the code length Q×Nt of the decoding target with the maximum code length Q×N. Note that, in FIG. 12, since the number Q of parallel code constructions is common, the comparison is expressed as a comparison between Nt and N. If the code length Q×Nt of the decoding target is the maximum code length Q×N, that is, in a case of step S103: Yes, the control unit 160 skips the processes of steps S104 to S106. If the code length Q×Nt of the decoding target is less than the maximum code length Q×N, that is, in a case of step S103: No, the control unit 160 applies the initial likelihood calculation process by the first likelihood calculation unit 120 as described in the first embodiment. First, the flowchart will be described regarding the case of step S103: No.

In step S104, the first likelihood calculation unit 120 performs the initial likelihood calculation process in the iterative decoding process at the first time. Step S104 illustrates the initial likelihood calculation process in the iterative decoding process at the first time in the first likelihood calculation unit 120, and illustrates an initial likelihood calculation step of performing the process on the basis of the code length Q×Nt of the decoding target. Specifically, in the first likelihood calculation unit 120, the likelihood calculation is performed first by the likelihood calculation unit 121-1 corresponding to step 1.

In step S105, the control unit 160 compares the index m representing the likelihood calculation step with M−Mt. If m<M−Mt is satisfied (step S105: Yes), as step S106, the control unit 160 adds 1 to the index m representing the likelihood calculation step, that is, m=m+1. The processes of steps S105 and S106 are processes in which the control unit 160 controls the likelihood calculation step for executing, among the likelihood calculations of the iterative decoding processes, the initial likelihood calculation process in the iterative decoding process at the first time by the first likelihood calculation unit 120. In step S104 subsequent to step S106, next, the likelihood calculation unit 121-2 corresponding to step 2 of the first likelihood calculation unit 120 performs the likelihood calculation. As described above, by iterating the processes of steps S104 to S106, in the case where the code length of the decoding target is Q×Nt, the likelihood calculation unit 121-1 to the likelihood calculation unit 121-(M−Mt) of the first likelihood calculation unit 120 execute the likelihood calculations. When the likelihood calculations are executed up to the designated likelihood calculation step, in step S105, the control unit 160 determines that m=M−Mt (step S105: No), and proceeds to the process of step S107 since the initial likelihood calculation process is completed.

In step S107, the control unit 160 adds 1 to the index m representing the likelihood calculation step, that is, m=M−Mt+1. Step S107 is a control process in which the control unit 160 controls an execution start position of the likelihood calculation step of the iterative decoding process. In the case where the code length of the decoding target is Q×Nt, the likelihood calculations of the likelihood calculation unit 121-(M−Mt+1) to the likelihood calculation unit 121-M of the first likelihood calculation unit 120 and the likelihood calculation unit 131-(M+1) to the likelihood calculation unit 131-(M+Mt) of the second likelihood calculation unit 130 are executed for the number of times corresponding to Loop which is the number of iterations of the iterative decoding process. The process in which the control unit 160 designates a start position of the likelihood calculation step of the iterative decoding process is the process of step S107.

In step S108, in the likelihood calculation unit 121-(M−Mt+1) to the likelihood calculation unit 121-M of the first likelihood calculation unit 120 and the likelihood calculation unit 131-(M+1) to the likelihood calculation unit 131-(M+Mt) of the second likelihood calculation unit 130, one likelihood calculation unit executes the likelihood calculation depending on a value of the index m representing the likelihood calculation step. As described above, the likelihood calculation is performed first by the likelihood calculation unit 121-(M−Mt+1) corresponding to step M−Mt+1 of the first likelihood calculation unit 120.

In step S109, the control unit 160 compares the index m representing the likelihood calculation step with M+Mt. If m<M+Mt is satisfied (step S109: Yes), as step S110, the control unit 160 adds 1 to the index m representing the likelihood calculation step, that is, m=m+1. The processes of steps S109 and S110 are processes in which the control unit 160 selects the likelihood calculation step of the likelihood calculation of one iterative decoding process and designates an end position. In step S108 subsequent to step S110, next, the likelihood calculation unit 121-(M−Mt+2) corresponding to step M−Mt+2 of the first likelihood calculation unit 120 performs the likelihood calculation. As described above, by iterating the processes of steps S108 to S110, the likelihood calculation unit 121-(M−Mt+1) of the first likelihood calculation unit 120 to the likelihood calculation unit 131-(M+Mt) of the second likelihood calculation unit 130 execute the likelihood calculations. When the end position of the likelihood calculation step of the likelihood calculation of one iterative decoding process is reached, in step S109, the control unit 160 determines that m=M+Mt (step S109: No), and proceeds to the process of step S111 since the likelihood calculation of one iterative decoding process is completed.

In step S111, the control unit 160 compares the index 1 of Loop which is the number of iterations of the iterative decoding process with Loop which is the number of iterations of the iterative decoding process. If 1<Loop is satisfied (step S111: Yes), as step S112, the control unit 160 adds 1 to the index 1 of Loop which is the number of iterations of the iterative decoding process, that is, 1=1+1. The processes of steps S111 and S112 are processes in which the control unit 160 controls the number of iterations of the likelihood calculation processes of the first likelihood calculation unit 120 and the second likelihood calculation unit 130, and the control unit 160 performs control so that the processes of steps S107 to S110 are iterated for the number of times corresponding to Loop. When the iterative decoding process is completed for the number of times corresponding to Loop, in step S111, the control unit 160 determines that 1=Loop (step S111: No), and proceeds to the process of step S113.

In step S113, similarly to step S103, the control unit 160 compares the code length Q×Nt of the decoding target with the maximum code length Q×N. Note that, in FIG. 12, since Q is common, the comparison is expressed as a comparison between Nt and N. If the code length Q×Nt of the decoding target is the maximum code length Q×N, that is, in a case of step S113: Yes, the control unit 160 skips the processes of steps S114 to S117. If the code length Q×Nt of the decoding target is less than the maximum code length Q×N, that is, in a case of step S113: No, the control unit 160 applies the terminal likelihood calculation process by the second likelihood calculation unit 130 as described in the first embodiment. First, the flowchart will be described for the case of step S113: No.

In step S114, the control unit 160 adds 1 to the index m representing the likelihood calculation step, that is, m=M+Mt+1. Step S114 is a control process in which the control unit 160 controls an execution start position of the likelihood calculation step of the terminal likelihood calculation process only in the iterative decoding process at the last time. In the case where the code length of the decoding target is Q×Nt, the likelihood calculation unit 131-(M+Mt+1) to the likelihood calculation unit 131-2M of the second likelihood calculation unit 130 execute the likelihood calculations in the process.

In step S115, the second likelihood calculation unit 130 performs the terminal likelihood calculation process in the iterative decoding process at the last time. Step S115 illustrates the terminal likelihood calculation process in the iterative decoding process at the last time in the second likelihood calculation unit 130, and illustrates a terminal likelihood calculation step of performing the process on the basis of the code length Q×Nt of the decoding target. Specifically, in the second likelihood calculation unit 130, the likelihood calculation is performed first by the likelihood calculation unit 131-(M+Mt+1) corresponding to step M+Mt+1.

In step S116, the control unit 160 compares the index m representing the likelihood calculation step with 2M. If m<2M is satisfied (step S116: Yes), as step S117, the control unit 160 adds 1 to the index m representing the likelihood calculation step, that is, m=m+1. The processes of steps S116 and S117 are processes in which the control unit 160 controls the likelihood calculation step for executing, among the likelihood calculations of the iterative decoding processes, the terminal likelihood calculation process in the iterative decoding process at the last time by the second likelihood calculation unit 130. In step S115 subsequent to step S117, next, the likelihood calculation unit 131-(M+Mt+2) corresponding to step M+Mt+2 of the second likelihood calculation unit 130 performs the likelihood calculation. As described above, by iterating the processes of steps S115 to S117, in the case where the code length of the decoding target is Q×Nt, the likelihood calculation unit 131-(M+Mt+1) to the likelihood calculation unit 131-2M of the second likelihood calculation unit 130 execute the likelihood calculations. When the likelihood calculations are executed up to the designated likelihood calculation step, in step S116, the control unit 160 determines that m=2M (step S116: No), and proceeds to the process of step S118 since the terminal likelihood calculation process is completed.

In step S118, the hard decision unit 140 makes a hard decision on a result of the likelihood calculation process output from the second likelihood calculation unit 130. The hard decision unit 140 generates and outputs a decoded bit sequence as a result of the hard decision.

In step S119, the frozen bit removing unit 150 removes unnecessary bit sequences other than the decoding information bit sequence, such as frozen bits, from the decoded bit sequence generated by the hard decision unit 140, and generates and outputs a decoded information bit sequence. Consequently, the decoding process of the decoding target having a code length of Q×Nt by the decoding device 100 is completed.

Next, a case will be described where the code length Q×Nt of the decoding target is the same as the maximum code length Q×N supportable by the decoding device 100, that is, Nt=N. Since the code length Q×Nt of the decoding target is the same as the maximum code length Q×N, that is, Nt=N is satisfied (step S103: Yes) after performing the processes of steps S101 and S102 as described above, the decoding device 100 skips the initial likelihood calculation process which corresponds to the processes of steps S104 to S106. In the decoding device 100, in the processes of steps S107 to S112, all of the likelihood calculation units 121-1 to 121-M of the first likelihood calculation unit 120 and the likelihood calculation units 131-(M+1) to 131-2M of the second likelihood calculation unit 130 execute the likelihood calculation for the number of times corresponding to Loop which is the number of iterations of the iterative decoding process, that is, perform the iterative decoding processes, and proceed to step S111. Similarly to the process of step S103, since the code length Q×Nt of the decoding target is the same as the maximum code length Q×N, that is, Nt=N is satisfied (step S113: Yes), the decoding device 100 skips the terminal likelihood calculation process which corresponds to the processes of steps S114 to S117. In the decoding device 100, the processes of steps S118 and S119 are as described above.

As described above, the decoding device 100 for a maximum code length of Q×N can execute the decoding process even in a case where the code length Q×Nt of the decoding target is less than or equal to the maximum code length Q×N as illustrated in the flowchart of FIG. 12.

The decoding device according to the present disclosure achieves an effect that it is possible to perform decoding for a plurality of code lengths in decoding of a QC-polar code while preventing a circuit scale from increasing.

The configurations described in the above embodiments are merely examples and can be combined with other known technology, the embodiments can be combined with each other, and part of the configurations can be omitted or modified without departing from the gist thereof.

What is claimed is:
1. A decoding device comprising:
processing circuitry configured to:
perform an initialization process on a storage element for likelihood information to be used in likelihood calculation of an iterative decoding process on a basis of likelihood information to be input and a code length of a bit sequence to be decoded;

execute M separate first likelihood calculations corresponding to step 1 to step M where M is an integer of 2 or more, in likelihood calculation of the iterative decoding process;
execute M separate second likelihood calculations corresponding to step M+1 to step 2M in likelihood calculation of the iterative decoding process;
make a hard decision on a result of likelihood calculation and to generate a decoded bit sequence;
remove a frozen bit and a bit sequence based on the code length of the bit sequence to be decoded from the decoded bit sequence and to generate a decoded information bit sequence; and
control likelihood calculation of the iterative decoding process on a basis of the code length of the bit sequence to be decoded, wherein
each of the first likelihood calculations and the second likelihood calculations includes one or more steps,
the processing circuitry is configured to perform the one or more steps of each of the first likelihood calculations and the second likelihood calculations iteratively,
Mt is a positive integer less than or equal to the M, and
the processing circuitry is further configured to perform an initial likelihood calculation process for executing M-Mt separate likelihood calculations corresponding to step 1 to step M−Mt, and an iterative decoding process for iteratively executing Mt separate likelihood calculations corresponding to step M−Mt+1 to step M.

2. A decoding device comprising:
processing circuitry configured to:
perform an initialization process on a storage element for likelihood information to be used in likelihood calculation of an iterative decoding process on a basis of likelihood information to be input and a code length of a bit sequence to be decoded;
execute M separate first likelihood calculations corresponding to step 1 to step M where M is an integer of 2 or more, in likelihood calculation of the iterative decoding process;
execute M separate second likelihood calculations corresponding to step M+1 to step 2M in likelihood calculation of the iterative decoding process;
make a hard decision on a result of likelihood calculation and to generate a decoded bit sequence;
remove a frozen bit and a bit sequence based on the code length of the bit sequence to be decoded from the decoded bit sequence and to generate a decoded information bit sequence; and
control likelihood calculation of the iterative decoding process on a basis of the code length of the bit sequence to be decoded, wherein
each of the first likelihood calculations and the second likelihood calculations includes one or more steps,
the processing circuitry is configured to perform the one or more steps of each of the first likelihood calculations and the second likelihood calculations iteratively,
Mt is a positive integer less than or equal to the M, and
the processing circuitry is further configured to perform an iterative decoding process for iteratively executing Mt separate likelihood calculations corresponding to step M+1 to step M+Mt, and a terminal likelihood calculation process for executing M−Mt separate likelihood calculations corresponding to step M+Mt+1 to step 2M.

* * * * *